(12) United States Patent
Sasaki et al.

(10) Patent No.: US 6,207,070 B1
(45) Date of Patent: Mar. 27, 2001

(54) COMPOSITION FOR PIEZOELECTRIC CERAMICS

(75) Inventors: Satoshi Sasaki; Masaru Abe, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/373,195

(22) Filed: Aug. 12, 1999

(30) Foreign Application Priority Data

Aug. 19, 1998 (JP) .................................................. 10-232632

(51) Int. Cl.$^7$ ........................ C04B 35/493; H01L 41/187
(52) U.S. Cl. .................................... 252/62.9 PZ; 501/134
(58) Field of Search ....................... 252/62.9 PZ; 501/134

(56) References Cited

U.S. PATENT DOCUMENTS 5,527,481 * 6/1996 Otsu et al. ........................ 252/62.9 R

FOREIGN PATENT DOCUMENTS

| | | |
|---|---|---|
| 55-85085 * | 6/1980 | (JP) . |
| 6-333427 | 12/1994 | (JP) . |
| 7-30169 | 1/1995 | (JP) . |
| 7-82021 * | 3/1995 | (JP) . |
| 7-187777 | 7/1995 | (JP) . |
| 7-187778 | 7/1995 | (JP) . |

OTHER PUBLICATIONS

Derwent Abstract for Japanese patent 7–82021A.*

* cited by examiner

*Primary Examiner*—C. Melissa Koslow
(74) *Attorney, Agent, or Firm*—Oblon, Spivak, McClelland, Maier & Neustadt, P.C.

(57) ABSTRACT

Composition for piezoelectric ceramics includes a main component and a sub component. The main component is expressed with a general expression of $aPb(Mg_{1/3}Nb_{2/3})O_3$-$bPb(Yb_{1/3}Nb_{2/3})O_3$-$cPbTiO_3$-$dPbZrO_3$, where $a+b+c+d=1$, $0.01 \leq a \leq 0.07$, $0.01 \leq b \leq 0.07$, $0.35 \leq c \leq 0.55$, and $0.4 \leq d \leq 0.6$. The sub component contains 0.1 to 0.7 wt % of Mn in terms of manganese oxide, 0.01 to 0.3 wt % of Cr in terms of chromium oxide and 0.05 to 0.5 wt % of Co in terms of cobalt oxide per the weight of 1 mol of main component.

9 Claims, No Drawings

COMPOSITION FOR PIEZOELECTRIC CERAMICS

BACKGROUND OF THE INVENTION

1. Field of the Invention

The present invention relates to a composition for piezoelectric ceramics suitably for composing ceramic vibrators, ceramic filters, ceramic discriminators, ceramic resonators and the like.

2. Description of the Related Art

As compositions for piezoelectric ceramics suitably for composing ceramic vibrators, ceramic filters, or ceramic discriminators, compositions of $PbTiO_3$ or $PbTiO_3$-$PbZrO_3$ are conventionally well known, and many improvements have been proposed.

For example, generally known are materials of $PbTiO_3$-$PbZrO_3$, to which $MnO_2$, $Cr_2O_3$ and the like are added, for simply improving coefficient Qm of mechanical quality; materials of $PbTiO_3$-$PbZrO_3$, in which perovskite compound such as $Pb(Ni_{1/3}Nb_{2/3})O_3$ or $Pb(Mg_{1/3}Nb_{2/3})O_3$ as second or third components are made solute, for heightening porcelain characteristics; and the latter to which $MnO_3$, $CrO_3$ and the like are added for enhancing coefficient Qm of mechanical quality. Further, for improving temperature characteristic of electromechanical coupling coefficient or resonance frequency fr, known is that where the portion of Pb among the above mentioned components is substituted with Ba, Sr or Ca (Unexamined Japanese Patent Publication (kokai) Nos.6-333427, 7-30169, 7-82021, 7-187777 and 7-187778).

Recently, markets of portable terminal instruments of electronic information such as cellular phones are rapidly growing. Since these portable instruments undergo severe environmental changes (in particular, temperature change), electronic parts having excellent resistance against thermal shocks by temperature change under using circumstances, are required. However conventional compositions for piezo electric ceramics were concerned with problems that thermal shock resistance was inferior, changes occurred in piezoelectric characteristic or resonance frequency due to changes in temperature circumstances, and composed ceramic vibrators did not normally work.

There were the same problems in not only portable terminal instruments but also those for composing ceramic vibrators or the like for communication equipment to be installed in vehicles of furious changes under using circumstances.

On the other hand, by miniaturizing and laminating electric devices, mounting of electronic parts to substrates at high density is advancing and types of miniaturized electronic parts are changing from existing types having leading wires to those mounting in surface. Since parts for mounting in surfaces are exposed to temperature of around 250° C. in a reflow furnace when mounted, they must have excellent heat resistance. In regard to existing types having leading wires, by making solder non-Pb, welding temperature trends to be set at higher than theretofore, and reliability to soldering temperature is desired to be more improved.

However, there was a problem that although conventionally known composition of piezoelectric ceramics was excellent in heat resistibility, it was inferior in thermal shock resistance by temperature change under using circumstance, and if it composed electronic parts to be served in portable telephones or products violent in changes of temperature circumstances, piezoelectric characteristic was deteriorated by temperature change and it was difficult to compose electronic parts at which the present invention aims.

Generally when the piezoelectric ceramics are used to the ceramic vibrator, the coefficient (Qm) of the mechanical quality is demanded to be high as the characteristics of the piezoelectric ceramics (e.g., 500).

SUMMARY OF THE INVENTION

It is an object of the present invention to provide a composition for a piezoelectric ceramics suitably for composing electronic parts such as ceramic vibrators, ceramic filters, ceramic discriminators or the like.

According to the present invention, composition for piezoelectric ceramics comprises: a main component expressed with a general expression of $aPb(Mg_{1/3}Nb_{2/3})O_3$-$bPb(Yb_{1/3}Nb_{2/3})O_3$-$cPbTiO_3$-$dPbZrO_3$, where $a+b+c+d=1$, $0.01 \leq a \leq 0.07$, $0.01 \leq b \leq 0.07$, $0.35 \leq c \leq 0.55$, $0.4 \leq d \leq 0.6$ and a sub component containing 0.1 to 0.7 wt % of Mn in terms of manganese oxide, 0.01 to 0.3 wt % of Cr in terms of chromium oxide and 0.05 to 0. 5 wt % of Co in terms of cobalt oxide per the weight of 1 mol of main component.

By this structure, it is possible to provide a composition for piezoelectric ceramics having high curie temperature, excellent soldering heat resistance, and large electromechanical coupling coefficient (kt) of thickness longitudinal vibration mode as well as large coefficient (Qm) of mechanical quality, and beside excellent thermal shock resistance by temperature change under using circumstances.

The reason why the composite perovskite compound of $Pb(Mg_{1/3}Nb_{2/3})O_3$ and $Pb(Yb_{1/3}Nb_{2/3})O_3$ is made solute as third and fourth components to base composition of porcelain of $PbTiO_3$-$PbZrO_3$, is for improving the piezoelectric characteristic and the heat resistibility of the porcelain. Accordingly, it is possible to heighten the soldering heat resistance, as keeping high electromechanical coupling coefficient (kt) of thickness longitudinal vibration mode and the curie temperature (Tc).

The reason for adding the sub component containing 0.1 to 0.7 wt % of Mn in terms of manganese oxide, 0.01 to 0.3 wt % of Cr in terms of chromium oxide and 0.05 to 0.25 wt % of Co in terms of cobalt oxide per the weight of 1 mol of the main component, is for enhancing the coefficient (Qm) of the mechanical quality for the piezoelectric ceramics and improving the thermal shock resistance against the temperature change under the using circumstance. Accordingly, it is possible to provide such a composition for piezoelectric ceramics suitably for composing ceramic vibrators, ceramic filters, ceramic discriminators and the like having the high electromechanical coupling coefficient (kt) of thickness longitudinal vibration mode, the high coefficient (Qm) of the mechanical quality and the high curie temperature (Tc).

DETAILED DESCRIPTION OF THE INVENTION

Detailed description of the present invention will be described referring to the following examples.

As starting materials, chemically pure PbO, $TiO_2$, $ZrO_2$, $MgCO_3$, $Yb_2O_3$, $Nb_2O_5$, $MnO_2$, $Cr_2O_3$ and CoO were used, weighted and wet blended in a ball mill so that the compositions after baking were as desired as shown in Table 1. In Table 1, samples marked with "*" are comparative examples or conventional ones and out of the present invention.

TABLE 1

| Sample No. | a mol | b mol | c mol | d mol | MnO$_2$ wt % | Cr$_2$O$_3$ wt % | CoO wt % |
|---|---|---|---|---|---|---|---|
| 1 | 0.035 | 0.035 | 0.43 | 0.5 | 0.35 | 0.15 | 0.25 |
| *2 | 0 | 0.05 | 0.44 | 0.51 | 0.35 | 0.15 | 0.25 |
| 3 | 0.01 | 0.05 | 0.44 | 0.5 | 0.35 | 0.15 | 0.25 |
| 4 | 0.07 | 0.05 | 0.48 | 0.4 | 0.35 | 0.15 | 0.25 |
| *5 | 0.1 | 0.05 | 0.45 | 0.4 | 0.35 | 0.15 | 0.25 |
| *6 | 0.05 | 0 | 0.47 | 0.48 | 0.35 | 0.15 | 0.25 |
| 7 | 0.05 | 0.01 | 0.46 | 0.48 | 0.35 | 0.15 | 0.25 |
| 8 | 0.05 | 0.07 | 0.40 | 0.48 | 0.35 | 0.15 | 0.25 |
| *9 | 0.05 | 0.1 | 0.37 | 0.48 | 0.35 | 0.15 | 0.25 |
| *10 | 0.035 | 0.035 | 0.43 | 0.5 | 0 | 0.25 | 0.35 |
| 11 | 0.035 | 0.035 | 0.43 | 0.5 | 0.1 | 0.25 | 0.35 |
| 12 | 0.035 | 0.035 | 0.43 | 0.5 | 0.7 | 0.1 | 0.2 |
| *13 | 0.035 | 0.035 | 0.43 | 0.5 | 0.8 | 0.1 | 0.2 |
| *14 | 0.035 | 0.035 | 0.43 | 0.5 | 0.4 | 0 | 0.25 |
| 15 | 0.035 | 0.035 | 0.43 | 0.5 | 0.4 | 0.01 | 0.25 |
| 16 | 0.035 | 0.035 | 0.43 | 0.5 | 0.3 | 0.3 | 0.2 |
| *17 | 0.035 | 0.035 | 0.43 | 0.5 | 0.3 | 0.4 | 0.2 |
| *18 | 0.035 | 0.035 | 0.43 | 0.5 | 0.4 | 0.25 | 0 |
| 19 | 0.035 | 0.035 | 0.43 | 0.5 | 0.4 | 0.25 | 0.05 |
| 20 | 0.035 | 0.035 | 0.43 | 0.5 | 0.3 | 0.2 | 0.5 |
| *21 | 0.035 | 0.035 | 0.43 | 0.5 | 0.3 | 0.2 | 0.6 |
| *22 | 0.05 | 0.05 | 0.33 | 0.57 | 0.35 | 0.15 | 0.25 |
| 23 | 0.05 | 0.05 | 0.35 | 0.55 | 0.35 | 0.15 | 0.25 |
| 24 | 0.01 | 0.01 | 0.55 | 0.43 | 0.35 | 0.15 | 0.25 |
| *25 | 0.01 | 0.01 | 0.57 | 0.41 | 0.35 | 0.15 | 0.25 |
| *26 | 0.04 | 0.04 | 0.54 | 0.38 | 0.35 | 0.15 | 0.25 |
| 27 | 0.04 | 0.04 | 0.52 | 0.4 | 0.35 | 0.15 | 0.25 |
| 28 | 0.01 | 0.01 | 0.38 | 0.6 | 0.35 | 0.15 | 0.25 |
| *29 | 0.01 | 0.01 | 0.36 | 0.62 | 0.35 | 0.15 | 0.25 |
| *30 | 0.035 | 0.035 | 0.43 | 0.5 | — | — | — |
| *31 | 0.1 | — | 0.45 | 0.45 | — | — | — |

Mixed powders were calcined at the temperatures of 800 to 950° C. in an air atmosphere, and then wet ground in the ball mill.

Next, an organic binder was added to the thus made powders so as to form into granules and subsequently into squares of 25 mm×25 mm×1 mm under pressure of 2000 kg/cm$^2$ and the formed bodies were sintered at temperatures of 1140 to 1240° C.

The surface of thus obtained sintered bodies was ground so that the sintered bodies has the thickness of 0.5 mm. The sintered bodies were formed with electrode thereon, and polarization was processed thereto in the direction of 0.5 mm thickness in an insulating oil at 80 to 120° C. at DC voltage of 2 to 3 kv/mm and for 30 minutes of application time.

After the polarization process, elements were further ground so as to have the thickness of 0.25 mm, and cut into 7 mm length×4.5 mm width. Then, the elements were undergone on surface with silver deposition so as to form electrodes of 1 mm diameter to be elements for valuation.

The obtained elements for valuation were measured by an impedance analyzer in regard to capacitance (c), resonance frequency (fr), anti-resonance frequency (fa). With reference to measured results, electromechanical coupling coefficient (kt) of thickness longitudinal vibration mode and coefficient (Qm) of mechanical quality were obtained by calculation.

The valuation in regard to heat deterioration when soldering, i.e., the valuation of the soldering heat resistance was performed by immersing piezoelectric elements in a solder vessel at 260° C. for 30 minutes. Rates of change are shown with percentage calculated by differences between the electromechanical coupling coefficients before tests and those after 24 h of immersion in the solder vessel. The small the values are, the better the heat resistibility is.

The valuation in regard to resistibility to thermal shock by temperature change under using circumstances, i.e., the valuation of the thermal shock resistance was performed by holding piezoelectric elements in a thermal shock tester which has two thermostatic baths of −40° C. and 85° C., the elements being held at each of both temperatures, and repeating 100 cycles rapid heating and rapid cooling. Herein, 1 cycle means one treatment of the rapid heating and the rapid cooling.

Rates of change are shown with percentage calculated by differences between the electromechanical coupling coefficients before tests and those after the 100 cycles of the thermal shock tests. The small the values are, the better the heat resistibility is.

Those measured results are shown in Table 2. Sample numbers of Table 2 are the same as those of Table 1. In Table 2, Samples marked with "*" are comparative examples and out of the present invention.

Incidentally, the sample No.31 is a conventional example which was prepared by the same manner as the example for comparison with the present invention.

TABLE 2

| Sample No. | Electro-mechanical coupling coefficient (kt) % | Coefficient (Ωm) of mechanical quality | Rate of change of kt after heat resistance test % | Rate of change of kt after thermal shock test % |
|---|---|---|---|---|
| 1 | 44.1 | 750 | −0.5 | −0.9 |
| *2 | 38.3 | 690 | −10.8 | −28.8 |
| 3 | 40.2 | 680 | −1.2 | −1.1 |
| 4 | 40.0 | 690 | −1.5 | −1.2 |
| *5 | 39.4 | 670 | −2.0 | −15.1 |
| *6 | 39.3 | 670 | −11.3 | −23.3 |
| 7 | 40.0 | 660 | −0.8 | −1.0 |
| 8 | 40.1 | 690 | −1.3 | −1.8 |
| *9 | 36.5 | 680 | −1.9 | −14.0 |
| *10 | 40.2 | 520 | −1.6 | −13.5 |
| 11 | 42.5 | 600 | −1.5 | −1.3 |
| 12 | 42.7 | 620 | −1.5 | −1.2 |
| *13 | 38.1 | 490 | −1.8 | −15.6 |
| *14 | 40.1 | 550 | −2.0 | −13.2 |
| 15 | 41.9 | 630 | −1.0 | −1.5 |
| 16 | 42.3 | 656 | −1.3 | −2.0 |
| *17 | 39.1 | 480 | −1.7 | −14.4 |
| *18 | 40.0 | 560 | −1.9 | −11.5 |
| 19 | 42.0 | 666 | −1.2 | −1.8 |
| 20 | 41.8 | 620 | −1.2 | −1.8 |
| *21 | 39.4 | 470 | −2.0 | −13.6 |
| *22 | 38.8 | 500 | −2.0 | −12.8 |
| 23 | 40.3 | 580 | −1.9 | −1.6 |
| 24 | 40.4 | 590 | −1.8 | −1.7 |
| *25 | 38.6 | 510 | −2.0 | −11.9 |
| *26 | 38.7 | 500 | −1.9 | −12.5 |
| 27 | 40.2 | 590 | −1.4 | −1.4 |
| 28 | 40.3 | 610 | −1.5 | −1.9 |
| *29 | 39.0 | 510 | −2.0 | −10.5 |
| *30 | 40.8 | 80 | −1.9 | −25.6 |
| *31 | 39.5 | 80 | −13.8 | −44.3 |

The present invention makes the limitation to such a composition for the piezoelectric ceramics including: a main component expressed with a general expression of aPb(Mg$_{1/3}$Nb$_{2/3}$)O$_3$-bPb (Yb$_{1/3}$Nb$_{2/3}$)O$_3$-cPbTiO$_3$-dPbZrO$_3$, where a+b+c+d=1, b≦0.07 (preferably, 0.015), 0.35≦c≦0.55 (0.40≦c≦0.48), 0.4≦d≦0.6 (0.48≦d≦0.55) and a sub component containing 0.1 to 0.7 wt % (preferably, 0.15 to 0.5 wt %) of Mn in terms of manganese oxide, 0.01 to 0.3 wt % (preferably, 0.1 to 0.25 wt %) of Cr in terms of chromium oxide and 0.05 to 0.5 wt % (preferably, 0.1 to 0.3 wt %) of Co in terms of cobalt oxide per the weight of 1 mol of main component. The reason of this limitation will be explained as follows.

If "a" is smaller than 0.01, an effect of the soldering heat resistance cannot be available, and the value of rate of change kt after the test of the soldering heat resistance becomes larger (refer to Sample No.2).

Reversely, if "a" exceeds 0.07, the thermal shock resistance is deteriorated, and the present composition cannot applied to products aimed at by the invention (refer to Sample No.5).

If "b" is smaller than 0.01, an effect of the soldering heat resistance cannot be obtained, and the value of rate of change kt after the test of the soldering heat resistance becomes larger (refer to Sample No.6).

Reversely, if "b" exceeds 0.07, the thermal shock resistance is deteriorated, and the present composition cannot apply to products aimed at by the invention (refer to Sample No.9).

If "c" is smaller than 0.35, the thermal shock resistance is inferior, and the electromechanical coupling coefficient is made small (Sample No.22).

If "c" exceeds 0.55, the thermal shock resistance is also inferior, and the electro-mechanical coupling coefficient is made small (Sample No.25).

If "d" is smaller than 0.4, the thermal shock resistance is inferior, and the electromechanical coupling coefficient is made small (Sample No.26).

Reversely, if "d" exceeds 0.6, the thermal shock resistance is also inferior, and electro-mechanical coupling coefficient is made small (Sample No.29).

Further, if Mn, as the content of the sub component per the weight 1 mol of the main component, is less than 0.1 wt % in terms of manganese oxide, the thermal shock resistance is inferior (Sample No.10), and if exceeding 0.7 wt %, this resistance is also bad (Sample No.13).

Similarly, if Cr, as the content of the sub component per the weight of 1 mol of the main component, is less than 0.01 wt % in terms of chromium oxide, the thermal shock resistance is inferior (Sample No.14), and if exceeding 0.3 wt %, this resistance is also bad (Sample No.17).

Further, if Co, as the content of the sub component per the weight of 1 mol of the main component, is less than 0.05 wt % in terms of cobalt oxide, the thermal shock resistance is inferior (Sample No.18), and if exceeding 0.5 wt %, this resistance is also bad (Sample No.21).

If any sub component is not added as Sample No.30 (the comparative example), a desired high coefficient Qm of the mechanical quality cannot be obtained.

In summary, with respect to results of Table 2, judgements were made in that "more than or equal to 40%" is good in regard to the electromechanical coupling quality coefficient kt of the thickness longitudinal vibration mode, "more than or equal to 500" is good in regard to the coefficient Qm of the mechanical quality, "within ±2%" is good in regard to the rate of change kt after the electromechanical coupling coefficient of the thickness longitudinal vibration mode after the soldering heat resistance test, and "within ±2%" is good in regard to the rate of change of the electromagnetic coupling coefficient kt of the thickness longitudinal vibration mode after the thermal shock test.

Consequently, as apparently from Table 2, in regard to the electromechanical coupling coefficient kt of the thickness longitudinal vibration mode, Sample Nos.2, 5, 6, 9, 10, 13, 14, 17, 18, 21, 22, 25, 26 and 29 are out of the present invention. In regard to the coefficient Qm of the mechanical quality, Sample Nos.13, 17, 21 and 30 are out of the present invention. In regard to the rate of change kt after the electromechanical coupling coefficient of the thickness longitudinal vibration mode after the soldering heat resistance test, Sample Nos.2 and 6 are out of the present invention. In regard to the rate of change of the electromagnetic coupling coefficient kt of the thickness vertical vibration mode after the thermal shock test, Sample Nos.2, 5, 6, 9, 10, 13, 14, 17, 18, 21, 22, 25, 26, 29 and 30 are out of the present invention.

Therefore, Sample Nos.1, 3, 4, 7, 8, 11, 12, 15, 16, 19, 20, 23, 24, 27 and 28 are all within the range of the present invention.

Comparing with the conventional example (Sample No.31), it is apparent that the examples of the invention are excellent in the soldering heat resistance and the thermal shock resistance.

When the curie temperature (Tc) was measured by a thermal analyzer, it was seen that the compositions of the piezoelectric ceramics were all available more than 300° C.

According to the present invention, it is possible to obtain such composition for the piezoelectric ceramics in which the electromechanical coupling coefficient (kt) of the thickness longitudinal vibration mode and the coefficient (Qm) of the mechanical quality are high, the curie temperature is high, the soldering heat resistance is excellent, and the thermal shock resistance against the temperature change under the using circumstances is excellent.

From the above mentioned, the present invention can provides the composition for the piezo-electric ceramics suitably for composing electronic parts such as ceramic vibrators, ceramic filters, ceramic discriminators and the like having reliability excellent in the soldering heat resistance and thermal shock resistance.

What is claimed is:

1. A piezoelectric ceramic composition comprising:
a main component expressed with a general expression of $aPb(Mg_{1/3}Nb_{2/3})O_3\text{-}bPb(Yb_{1/3}Nb_{2/3})O_3\text{-}cPbTiO_3\text{-}dPbZrO_3$, where $a+b+c+d=1$, $0.01 \leq a \leq 0.07$, $0.01 \leq b \leq 0.07$, $0.35 \leq c \leq 0.55$, $0.4 \leq d \leq 0.6$; and
a subcomponent containing 0.1 to 0.7 wt % of Mn in terms of manganese oxide, 0.01 to 0.3 wt % of Cr in terms of chromium oxide and 0.05 to 0.5 wt % of Co in terms of cobalt oxide per the weight of 1 mol of main component, wherein
the composition has an electromechanical coupling coefficient $(kt) \geq 40.0\%$. a coefficient of mechanical quality $(Qm) \geq 500$, a rate of change of kt after heat resistance test is within the range of $-2.0\%$ to $2.0\%$ and a rate of change of kt after thermal shock test is within the range of $-2.0\%$ to $2.0\%$.

2. The composition according to claim 1, wherein $0.015 \leq a \leq 0.05$.

3. The composition according to claim 1, wherein $0.015 \leq b \leq 0.05$.

4. The composition according to claim 1, wherein $0.40 \leq c \leq 0.48$.

5. The composition according to claim 1, wherein $0.48 \leq d \leq 0.55$.

6. The composition according to claim 1, wherein the sub component contains 0.15 to 0.5 wt % of Mn in terms of manganese oxide.

7. The composition according to claim 1, wherein the sub component contains 0.1 to 0.25 wt % of Cr in terms of chromium oxide.

8. The composition according to claim 1, wherein the sub component contains 0.1 to 0.3 wt % of Co in terms of cobalt oxide.

9. A method of making a piezoelectric ceramic composition, the method comprising mixing PbO, $TiO_2$, $ZrO_2$, $MgCo_3$, $Yb_2O_3$, $Nb_2O_5$, $MnO_2$, $Cr_2O_3$ and CoO; and
forming the piezoelectric ceramic composition of claim 1.

* * * * *